(12) United States Patent
Tsushima et al.

(10) Patent No.: US 8,363,447 B2
(45) Date of Patent: Jan. 29, 2013

(54) STORAGE DEVICE AND INFORMATION RECORDING AND VERIFICATION METHOD

(75) Inventors: Tomohito Tsushima, Toyko (JP); Tsunenori Shiimoto, Kanagawa (JP); Shuichiro Yasuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 275 days.

(21) Appl. No.: 12/745,952

(22) PCT Filed: Dec. 11, 2008

(86) PCT No.: PCT/JP2008/072491
§ 371 (c)(1),
(2), (4) Date: Jun. 3, 2010

(87) PCT Pub. No.: WO2009/075318
PCT Pub. Date: Jun. 18, 2009

(65) Prior Publication Data
US 2010/0254178 A1 Oct. 7, 2010

(30) Foreign Application Priority Data
Dec. 12, 2007 (JP) .................................. 2007-320580

(51) Int. Cl.
*G11C 13/02* (2006.01)
(52) U.S. Cl. .................... 365/148; 365/100; 365/185.22
(58) Field of Classification Search .................. 365/100, 365/148, 185.22
See application file for complete search history.

(56) References Cited

U.S. PATENT DOCUMENTS

| | | | |
|---|---|---|---|
| 6,662,263 B1 * | 12/2003 | Wong ............................ | 711/103 |
| 7,286,388 B1 | 10/2007 | Chen et al. | |
| 7,289,351 B1 | 10/2007 | Chen et al. | |
| 2004/0109362 A1 * | 6/2004 | Gongwer et al. ............. | 365/200 |
| 2004/0114429 A1 | 6/2004 | Ehiro | |
| 2007/0008770 A1 | 1/2007 | Nagao et al. | |
| 2010/0061148 A1 * | 3/2010 | Komatsu .................. | 365/185.03 |
| 2010/0097855 A1 * | 4/2010 | Bayle ....................... | 365/185.03 |

FOREIGN PATENT DOCUMENTS

| | | |
|---|---|---|
| EP | 1557841 A2 | 7/2005 |
| EP | 1840901 A1 | 10/2007 |

(Continued)

OTHER PUBLICATIONS

European Search Report dated Dec. 20, 2010 for corresponding European Appl. No. 08859874.3.

(Continued)

*Primary Examiner* — Hoai V Ho
*Assistant Examiner* — Jay Radke
(74) *Attorney, Agent, or Firm* — K&L Gates LLP

(57) ABSTRACT

A storage device capable of reducing a number of cycles necessary for a verify at a time of multi-bit recording is provided. An initial value of a potential difference VGS between a gate and a source of a switching transistor at the time of the verify is set to a value varied based on a resistance value level of multi-bit information. In the case of recording 2 bits when "01" is the information, an initial value VGS01 is set to be smaller than VGS=1.7 V corresponding to the target resistance value level "01", and when "00" is the information, a value is set to be lower than VGS=2.2 V corresponding to the target resistance value level "00" and higher than the above-described VGS01. This can reduce the number of cycles necessary for the verify process.

18 Claims, 10 Drawing Sheets

FOREIGN PATENT DOCUMENTS

| | | |
|---|---|---|
| EP | 1865512 A2 | 12/2007 |
| JP | 4356786 | 12/1992 |
| JP | 2004-185756 | 7/2004 |
| JP | 2005-235360 | 9/2005 |
| JP | 2007-18615 | 1/2007 |
| JP | 2007-018615 | 1/2007 |

OTHER PUBLICATIONS

Japanese Office Action issued on Aug. 21, 2012 for corresponding Japanese Application No. 2007-320580.

* cited by examiner

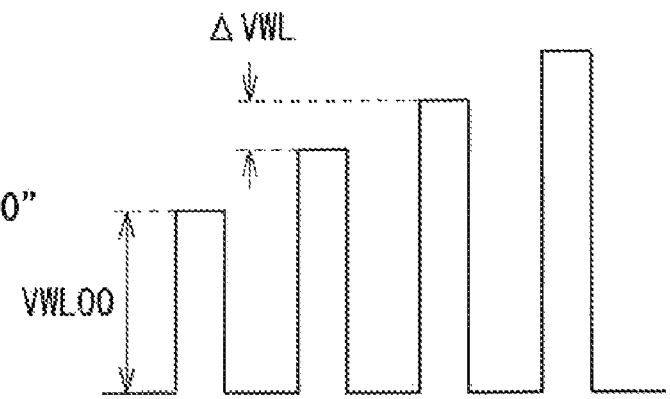
FIG. 9A LEVEL "00"
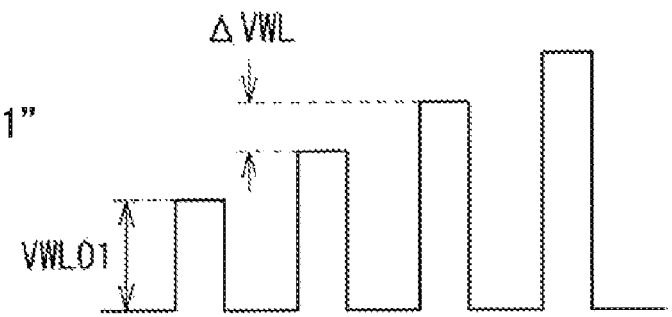
FIG. 9B LEVEL "01"
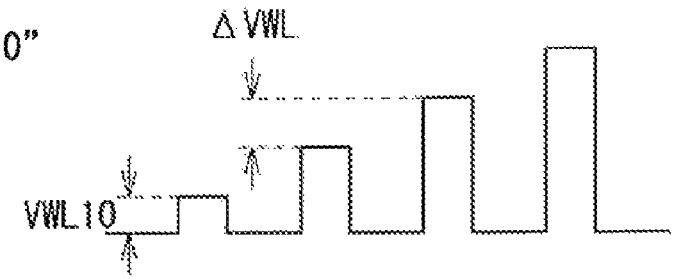
FIG. 9C LEVEL "10"

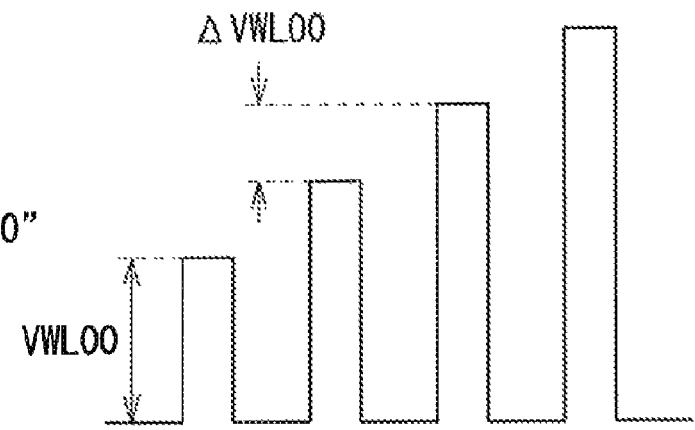
FIG. 11A LEVEL "00"
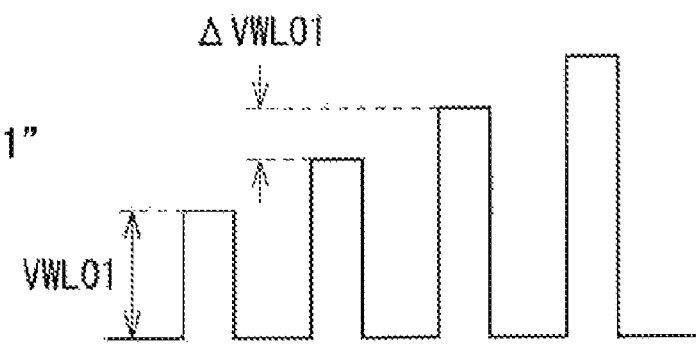
FIG. 11B LEVEL "01"
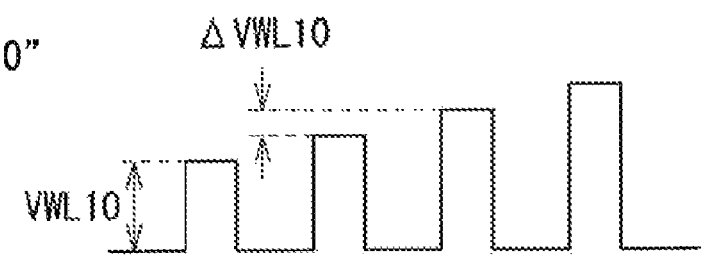
FIG. 11C LEVEL "10"

STORAGE DEVICE AND INFORMATION RECORDING AND VERIFICATION METHOD

CROSS REFERENCE TO RELATED APPLICATIONS

The present application is a national stage of International Application No. PCT/JP2008/072491 filed on Dec. 11, 2008 and claims priority to Japanese Patent Application No. 2007-320580 filed on Dec. 12, 2007 the disclosures of which are incorporated herein by reference.

BACKGROUND

The present invention relates to storage device including a memory cell having a storage element and a switching element, and particularly relates to a storage device performing recording by a verify control, and a method of recording information.

In an information device such as a computer, a high-density DRAM (Dynamic Random Access Memory) capable of high-speed operation has been widely used. However, in the DRAM, since the manufacture process is complicated in comparison with a logic circuit and a signal processing circuit typically used in an electronic device, there is an issue that the manufacture cost is high. Also, the DRAM is a volatile memory in which information is erased by turning off the power source, and it is necessary to frequently perform a refresh operation.

Thus, nonvolatile memory in which the information is not erased even when turning off the power source, for example, an FeRAM (Ferroelectric Random Access Memory), an MRAM (Magnetoresistive Random Access Memory), and the like have been proposed. In these memories, it is possible to continuously hold the written information for a long time without supplying the electric power, and, also, since it is not necessary to perform the refresh operation, the power consumption may be reduced correspondingly. However, there is an issue that miniaturization is not easy in the FeRAM, and there is an issue that a write current is large in the MRAM (for example, Non-patent Document 1).

Thus, as a memory suitable for speeding up the writing speed of the data, a storage device of a new type as illustrated in FIG. 16 and FIG. 17 has been proposed.

FIG. 16 illustrates a memory cell 100 of the storage device. This memory cell 100 includes a variable resistance element 110 whose cross-sectional structure is illustrated in FIG. 17, and an MOS transistor 120 (switching element). The variable resistance element 110 is formed by stacking an electrode 111, an ion source layer 112, a high resistance layer 113, and an electrode 114. The electrode 111 is electrically connected to a bit line BLR, and the electrode 114 is electrically connected to one terminal of the MOS transistor 120, respectively. The other terminal of the MOS transistor 120 is electrically connected to a bit line BLT, and a gate of the MOS transistor 120 is electrically connected to a word line WL, respectively.

In this storage device, when a voltage is applied to the electrode 114 and the electrode 111 so that a current flows from the ion source layer 112 to the high resistance layer 113, the high resistance layer 113 is changed to have a low resistance, and data is written. On the other hand, when the voltage is applied to the electrode 114 and the electrode 111 so that the current flows from the high resistance layer 113 to the ion source layer 112, the high resistance layer 113 is changed to have a high resistance, and the data is erased.

In such a storage device, in comparison with an existing nonvolatile memory or the like, the memory cell may be composed of a simple structure so that there is no size dependency of the element, and it is possible to obtain a large signal so that there is a characteristic resistant to scaling. Also, there is a great advantage that multi-bit recording, that is, storing data of 2 bits or more in one memory cell is possible by controlling a recording current and a recording voltage (Patent Document 1).

Non-patent Document 1: Nikkei Electronics, 2007.7.16, p. 98
Patent Document 1: Japanese Unexamined Patent Publication No. 2005-235360

SUMMARY

However, to perform the multi-value recording in the new-type of storage device described above, in comparison with a single-value recording, it is necessary to limit the resistance value of the memory cell in a specific narrow range, and it is necessary to properly adjust the resistance value for each writing operation of each cell. As that method, a method of combining a verify reading and a verify re-writing (hereinafter, simply referred to as verify by combination) is considered. That is, the verify reading is performed after the writing operation, and the writing operation is finished as the writing is succeeded when the resistance is a predetermined low resistance, and the re-writing is performed as the writing is failed when the resistance is a high resistance equal to or higher than the predetermined value. And, although this cycle is repeated up to an upper-limit number, it is desirable to reduce the cycle number as much as possible for speed-up.

In view of the foregoing problems, it is an object of the present invention to provide a storage device capable of reducing a number of cycles necessary for a verify at a time of a multi-bit recording, and a method of recording information.

A storage device of the present invention including a plurality of memory cells which have a storage element having a pair of electrodes, and recording multi-value information by applying a voltage to the electrodes, and a switching element having and a first input-output terminal, a second input-output terminal, and a control terminal, and in which the first input-output terminal is connected to one of the electrodes of the storage element includes: a verify control means for determining whether or not the information is properly recorded in the storage element, and performing recording in response to a result of the determining; and an initial value setting means for individually setting an initial value of a potential difference between the control terminal and the second input-output terminal of the switching element at a time of a verify based on the multi-bit information when the multi-bit information is being recorded in the storage element.

A method of recording information of the present invention performs, in a storage device including a plurality of memory cells which have a storage element having a pair of electrodes, and recording multi-bit information by applying a voltage to the electrodes, and a switching element having a first input-output terminal, a second input-output terminal, and a control terminal, and in which the first input-output terminal is connected to one of the electrodes of the storage element, a verify operation determining whether or not the information is properly recorded in the storage element, and recording in response to a result of the verify operation, where an initial value of a potential difference between the control terminal and the second input-output terminal of the switching element at a time of a verify is individually set based on the multi-bit information when the multi-bit information is being recorded in the storage element.

In the storage device and the method of recording the information of the present invention, whether or not the information is properly recorded in the storage element is determined, and recording in response to the result of the determination is performed, however, at that time, the initial value of the potential difference between the control terminal and the second input-output terminal of the switching element at the time of the verify control is individually set based on the multi-bit information, that is, the initial value is varied corresponding to the magnitude of the resistance value level of the multi-bit information being recorded, thereby the verify control is properly performed.

According to the storage device and the method of recording the information of the present invention, since the initial value of the potential difference between the control terminal and the second input-output terminal of the switching element at the time of the verify is individually set in accordance with the multi-bit information, the number of cycles necessary for the verify is reduced, and it is possible to greatly reduce the time necessary for the multi-value recording.

Moreover, by changing an increase of the potential difference between the control terminal and the second input-output terminal of the switching element (step voltage) based on the multi-bit information, the adjustment capability of the resistance value level is improved, and it is possible to sufficiently ensure a margin necessary between the resistance value levels.

Additional features and advantages of the present invention are described in, and will be apparent from, the following Detailed Description and the Figures.

BRIEF DESCRIPTION OF FIGURES

FIG. 9 is a waveform diagram for explaining the verify control in the first embodiment.

FIG. 11 is a waveform diagram for explaining the verify control in a second embodiment.

DETAILED DESCRIPTION

Hereinafter, a description will be made in detail on embodiments of the present invention with reference to the drawings.

First Embodiment

Figure 1:
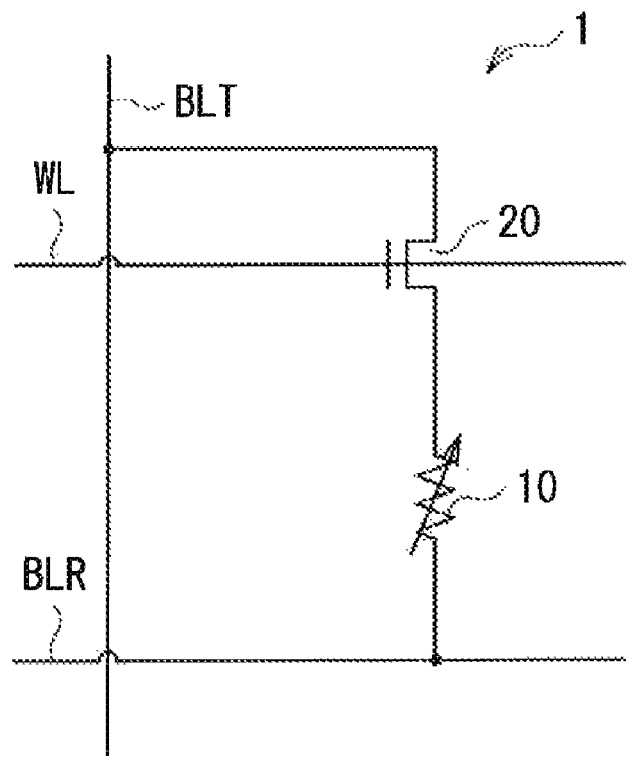
FIG. 1 is a circuit configuration view of a storage device (memory cell) according to a first embodiment of the present invention.

FIG. 1 illustrates a memory cell 1 of a storage device according to a first embodiment of the present invention. The memory cell 1 includes a storage element, for example, a variable resistance element 10 illustrated in FIG. 2, and an N-channel MOS type transistor 20 as a switching element. In the storage device, a plurality of memory cells 1 are arranged in an array state or a matrix state by regarding the memory cell 1 as a storage unit. FIG. 3 illustrates an equivalent circuit at the time of writing operation of the memory cell 1.

The variable resistance element 10 is formed, for example, by stacking an electrode 11, an ion source layer 12, a high resistance layer (variable resistance layer) 13, and an electrode 14.

The electrodes 11 and 14 are, for example, composed of a metal material such as Al, Cu, and W. The high resistance layer 13 is, for example, formed of a metal material, a rare earth element, an oxide or a nitride of mixture of the metal material and the rare earth element, or a semiconductor material, and has a function in which the resistance value is changed in accordance with the direction of an electric field generated between the electrodes 11 and 14 by applying a voltage between the two electrodes 11 and 14 as will be described later.

The ion source layer 12 is, for example, comprises at least one of the metal elements of Cu, Ag, and Al, and at least one of the chalcogen elements of Te, S, and Se, and is formed of, for example, CuTeSi, GeSbTeSi, CuGeTeSi, AgGeTeSi, AgTeSi, AlTeSi, AlGeTeSi, ZrTeAl, CuZrTeAl, CuSSi, CuGeSSi, CuSeSi, CuGeSeSi, or the like.

Cu and Ag described above are elements which easily travel in the ion source layer 12 and the high resistance layer 13 when being positive ions. Te is an element capable of reducing the resistance value of the ion source layer 12 to be smaller than the resistance value of the high resistance layer 13 when the variable resistance element 10 is turned on. Thus, in the ion source layer 12, in the case where Te is used as the chalcogen element, it is possible to limit a part where the resistance value is largely changed to the high resistance layer 13, and it is possible to improve the stability of the memory operation. Also, in the ion source layer 12, in the case where Cu is used as an element to become the positive ion, and, moreover, Te is used as the chalcogen element, it is possible to reduce the resistance value of the ion source layer 12 to be sufficiently smaller than the resistance value of the high resistance layer 13 when the valuable resistance element 10 is turned on, and thus it is possible to further improve the stability of the memory operation.

Also, Al described above forms a chemically-stable oxide when the variable resistance element 10 is switched from the low resistance state to the high resistance state, and thereby the retention characteristics of the erased state (high resistance state) are improved. Si is an element capable of non-crystallizing the ion source layer 12, and increasing the crystallization temperature of the ion source layer 12. Thus, in the case where an appropriate amount of Si is contained in the ion source layer 12, the state change such as crystallization caused by heat or the like received during the process is suppressed, and it is possible to improve the stability of the memory operation. In the ion source layer 12, for example, like TeAlZrOx, O (oxygen) may be further contained, and thereby it is possible to improve the retention characteristics and the controllability of the resistance value at the time of the data writing.

One electrode 11 of the variable resistance element 10 is electrically connected to the bit line BLR illustrated in FIG. 1, and the other electrode 14 is electrically connected to a first input-output terminal (drain/source) 20a of the transistor 20, respectively. A second input-output terminal (source/drain) 20b of the transistor 20 is electrically connected to the bit line BLT, and a control terminal 20c (gate terminal) of the transistor 20 is electrically connected to a word line WL, respectively.

In FIG. 3 a first pulse voltage (VBLR) is supplied from a first power source 21 to the electrode 11 of the variable resistance element 10 through the bit line BLR, and a second pulse voltage (VWL) is supplied from a second power source 22 to a control terminal 20c of the transistor 20 through the word line WL. Although a third pulse voltage (VBLT) is supplied from a third power source 23 to the second input-output terminal 20b of the transistor 20, the second input-output terminal 20b may be grounded (GND) through the bit line BLT (refer to FIG. 7).

Here, in this embodiment of FIG. 3, the first power source 21 and the third power source 23 are fixed voltage sources in which the respective write voltage values (pulse height) are constant, and, on the other hand, the voltage value of the second power source 22 may be changed by an adjustment circuit 24 (adjustment means). That is, at the time of the information writing, it is possible to arbitrarily reduce or increase the voltage value applied to the control terminal 20c of the transistor 20.

Specifically, for example, the second power source 22 has the configuration including a plurality of DC power sources for writing, each providing a different voltage value (pulse height), and the selection of the power source is performed by the adjustment circuit 24. Also, the waveform of these voltage sources need not be a pulse waveform in a literal sense but alternatively may be a ramp-shaped waveform.

In this embodiment of FIG. 3, since the VWL supplied from the second power source 22 is variable in this manner, the initial value of the potential difference between the control terminal 20c and the second input-output terminal 20b of the transistor 20 (voltage VGS between the source and the gate=VWL−VBLT) at the time of the verify control is individually set based on the multi-bit information (resistance value level) as will be described later. Specifically, the initial value of the VGS is set to be small in the case where the resistance value level corresponding to the multi-bit information is large, and is set to be large in the case where the resistance value level is small. Also, the initial value at this time is set to the value corresponding to the resistance value lower than the resistance value level corresponding to the multi-bit information.

In addition, the WL adjustment circuit 24 increases the VWL (increase ΔVWL) for each recording by the verify control, and this ΔVWL is set to a value varied for each resistance value level of the multi-bit information in the case where the multi-bit recording is performed. Specifically, the ΔVWL is the value which is varied in accordance with the magnitude of the incremental change of the recording resistance of the variable resistance element 10 by the current, and the ΔVWL is set to be small in a region where the magnitude of the incremental change of the recording resistance by the current is large (the voltage VGS between the source and the gate of the transistor 20 is small), and is set to be large in a region where the magnitude of the incremental change of the recording resistance is small (the VGS is large). In addition, a specific example of a verify control means, an initial value setting means, and a potential difference change means of the present invention is composed of the first power source 21, to the third power source 23, and the WL adjustment circuit 24 described above.

Next, the operation of the storage device (memory cell 1) of this embodiment will be described.

(Writing)

When a negative potential (− potential) is applied to the electrode 14 and a positive potential (+ potential) is applied to the electrode 11 by the third power source 23 and the first power source 21 respectively, and the current flows from the ion source layer 12 to the high resistance layer 13, at least one of the metal elements of Cu, Ag and Zn is ionized and diffuses from the ion source layer 12 to inside the high resistance layer 13 and combines with an electron on the electrode 14 side and is deposited or remains in the state of being diffused inside the high resistance layer 13. As a result, a current path containing a large amount of the above-described metal element is formed inside the high resistance layer 13 or a large number of defects caused by the above-described metal element are formed inside the high resistance layer 13 and the resistance value of the high resistance layer 13 is reduced. At this time, since the resistance value of the ion source layer 12 is originally low in comparison with the resistance value of the high resistance layer 13 before the writing, the resistance value of the whole variable resistance element 10 is also reduced (that is, the variable resistance element 10 is turned on) by reducing the resistance value of the high resistance layer 13. In addition, the resistance of the whole variable resistance element 10 at this time becomes the write resistance. After that, when the potential applied to the electrodes 11 and 14 is set to zero, and the voltage applied to the variable resistance element 10 is set to zero, the resistance value of the variable resistance element 10 is held in the low state. In this manner, the writing of the information is performed.

(Erasing)

Next, when a positive potential (+ potential) is applied to the electrode 14 and a negative potential (− potential) is applied to the electrode 11 by the third power source 23 and the first power source 21 respectively and the current flows from the high resistance layer 13 to the ion source layer 12, the above-described metal element constituting the current path or an impurity level formed in the high resistance layer 13 is ionized, and travels in the high resistance layer 13 to return to the ion source layer 12 side. As a result, the current path or the defect is eliminated in the high resistance layer 13, and the resistance value of the high resistance layer 13 is increased. At this time, since the resistance value of the ion source layer 12 is originally low, the resistance value of the whole variable resistance element 10 is also increased (that is, the variable resistance element 10 is turned off) by increasing the resistance value of the high resistance layer 13. In addition, the resistance value of the whole variable resistance element 10 at this time becomes the erasing resistance. After that, when the potential applied to the electrodes 11 and 14 is set to zero, and the voltage applied to the variable resistance element 10 is set to zero, the resistance value of the variable resistance element 10 is held in the high state. In this manner, the erasing of the written information is performed.

By repeating such processes, it is possible to repeatedly perform the writing of the information in the variable resistance element 10, and the erasing of the written information.

At this time, for example, in the whole variable resistance element 10, when the state in which the resistance is the write resistance (low resistance state) is corresponded to information of "1", and the state in which the resistance is the erasing resistance (high resistance state) is corresponded to information of "0", respectively, it is possible to change the information of the variable resistance element 10 from "0" to "1" by applying the negative potential to the electrode 14, and it is possible to change the information of the variable resistance element 10 from "1" to "0" by applying the positive potential to the electrode 14.

Also, in the variable resistance element 10, it is possible to hold the resistance value in the wide range, and it is possible to limit the magnitude of the current path by controlling the current amount flowing to the cell. Therefore, at least in one of the high resistance state and the low resistance state, it is possible to form the current path having the magnitude of a plurality of steps, and it is possible to stably hold that state. Therefore, by associating the plurality of resistance value levels corresponding to the magnitude of the current path and the information, the multi-bit recording of 2 more bits of data or information is possible, and it is possible to realize high capacity.

For example, in the variable resistance element 10, when the state in which the write resistance is the lowest corresponds to "11", the state in which the write resistance is the second lowest corresponds to "10", the state in which the write resistance is the third lowest corresponds to "01", and the erasing state corresponds to "00", respectively, it is possible to change the information in the direction where the resistance of the variable resistance element 10 becomes lower, such that the information of the variable resistance element 10 is changed from "00" to "01", from "01" to "11", or from "10" to "11", for example, by applying the negative potential to the electrode 14, and controlling the current flowing to the variable resistance element 10 at the same time. Similarly, it is possible to return the information of the variable resistance element 10 from "01" "10" or "11" to "00" by applying the positive potential to the electrode 14.

(Reading)

In the case where the reading of the information recorded as described above is performed, when the negative potential of a degree that the writing operation does not occur is applied to the electrode 14 and the positive potential is applied to the electrode 11 or, in an opposite manner, the positive potential of a degree that the erase operation does not occur is applied to the electrode 14 and the negative potential is applied to the electrode 11, and the current flows from 13 to 12 or from 12 to 13 respectively, the weak current corresponding to the resistance value of the write state or the stronger current corresponding to the resistance value of the erasing state flows. By detecting this current value, for example, with a sense amplifier or the like installed outside a memory cell array, it is possible to determine whether the variable resistance element 10 is in the low resistance state ("1") or the high resistance state ("0"). Same is true in the case of multi-bit information.

In this manner, since the variable resistance element 10 of this embodiment has the simple configuration by only stacking the electrode 11, the ion source layer 12, the high resistance layer 13, and the electrode 14, it is possible to perform the write and the erasing of the information even when the variable resistance element 10 is miniaturized, and since it is possible to hold the resistance value of the high resistance layer 13 without supplying the electric power, it is possible to store the information over a long period. Also, since the resistance value of the high resistance layer 13 is not changed by the reading, and it is not necessary to perform the refresh operation, it is possible to reduce the power consumption correspondingly.

(Verify)

As described above, in the verify control, the reading during verify is performed after a writing operation, and a writing operation completes successfully when the variable resistance element 10 has been verified to be the high resistance whereas the writing operation fails when the variable resistance element 10 has the low resistance, and the write operation is performed again. This cycle is repeated up to an upper-limit number. Hereinafter, the verify control will be described.

In the equivalent circuit illustrated in FIG. 3, the cell application current may be approximated as below.

$$\text{Cell application current} \approx \frac{1}{2} \cdot \frac{W}{L} \mu s Cox(Vg - Vs - Vt)^2 \quad \text{[Formula 1]}$$
$$= \frac{1}{2} \cdot \frac{W}{L} \mu s Cox(VWL - VBLT - Vt)^2$$

Here, W: channel width, L: channel length, μs: surface mobility of carrier, Cox: gate capacity for each unit area, Vg: gate voltage, Vs (=0V): source voltage, Vt: threshold voltage, VWL: word line voltage, and VBLT: bit line BLT voltage.

Figure 4:
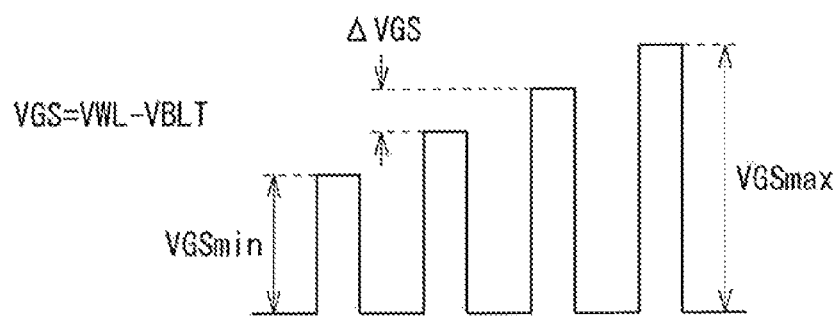
FIG. 4 is a waveform diagram for explaining a verify control.

The write current at the time of the verify is adjusted mainly by the potential difference (VGS) between the gate and the source of the transistor 20 by using the above-described current formula, and, specifically, adjusted by one of the VWL and the voltage VBLT applied to the bit line BLT, or by both of them. When the re-writing is performed without reaching the predetermined resistance value level, the voltage is increased to be larger than that of the previous writing in the VGS, and the recording resistance is adjusted. FIG. 4 schematically illustrates this state. In the example, VGSmin is an initial value, the cycle upper limit is 10, and the verify is performed until reaching a voltage upper limit VGSmax. The voltage is increased by ΔVGS each time. In the figure, although the verify reading is not illustrated, the verify reading is inserted after the application of the voltage pulse.

However, in the case of the multi-bit recording, when the initial value VGSmin of the VGS corresponding to all the resistance value levels of the multi value multi-bit information is a fixed value, there is an issue that the time necessary for the verify becomes long as will be described below.

Figure 5:
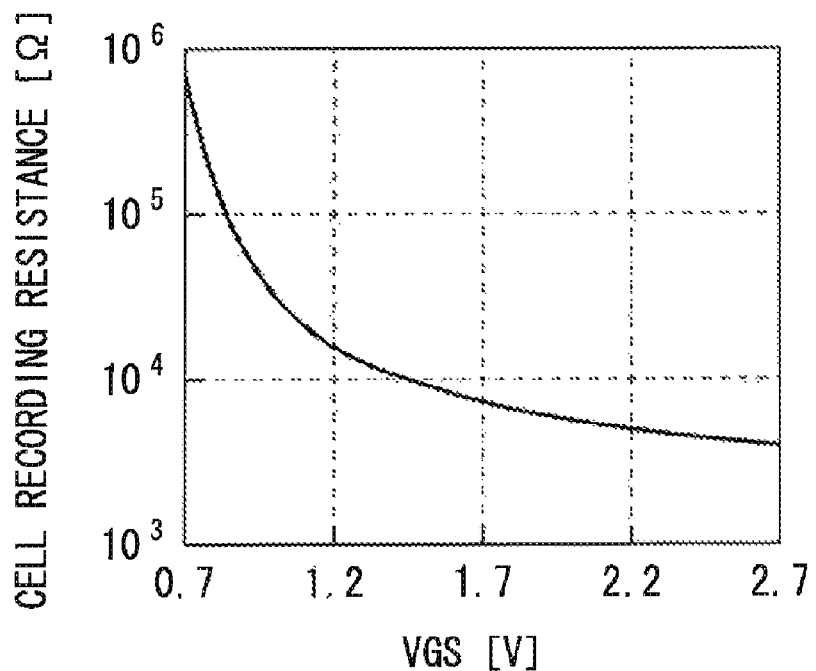
FIG. 5 is a view illustrating VGS-cell recording resistance characteristics of the memory cell.
Figure 6:
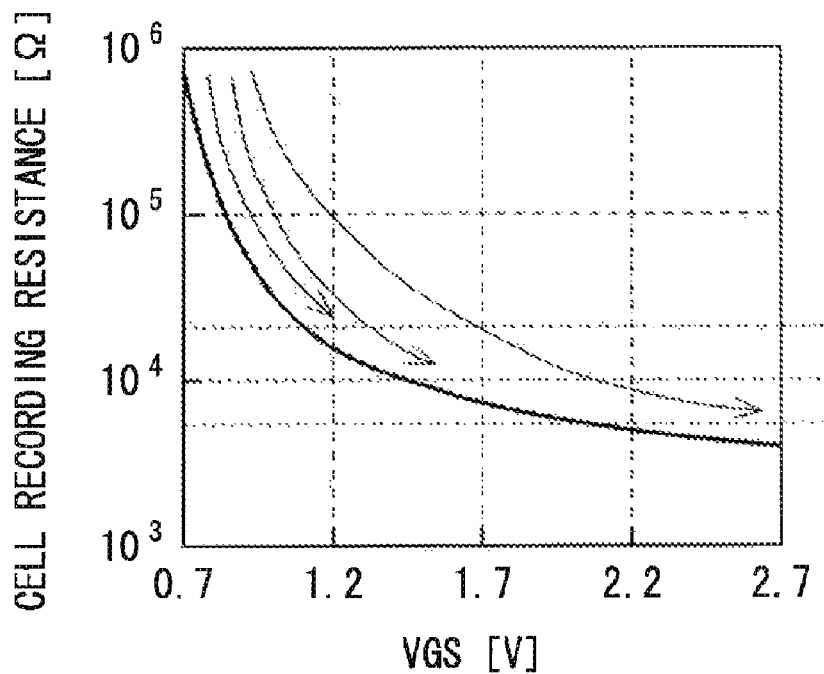
FIG. 6 is a view for explaining the transition state of a resistance value.

FIG. 5 illustrates an example of the relationship of the above-described VGS and the cell recording resistance. In an example of the multi-bit recording, when there is a multi-bit memory of 2 bit/cell, that is to say 4 resistive values or states per cell, wherein 3 out of 4 of the values is realized via writing and the remaining 1 value is realized via erasing it is necessary to adjust the above-described verify operation by stepping up the VGS until reaching the resistance value level as illustrated in FIG. 4 (verify schematic view), and FIG. 6 (transition of the resistance value). However, when the initial value VGSmin of the VGS corresponding to the multi-bit information is set to the same fixed value, depending on the predetermined resistance value level, the number of read operations during verify is large in comparison with that of another resistance value level, and the time necessary for the verify becomes long as a result. Thus, in this embodiment, as will be described below, the initial value of the VGS (VGSmin) of the memory cell 1 is set to be varied based on each resistance value level of the multi-bit information.

Figure 7:
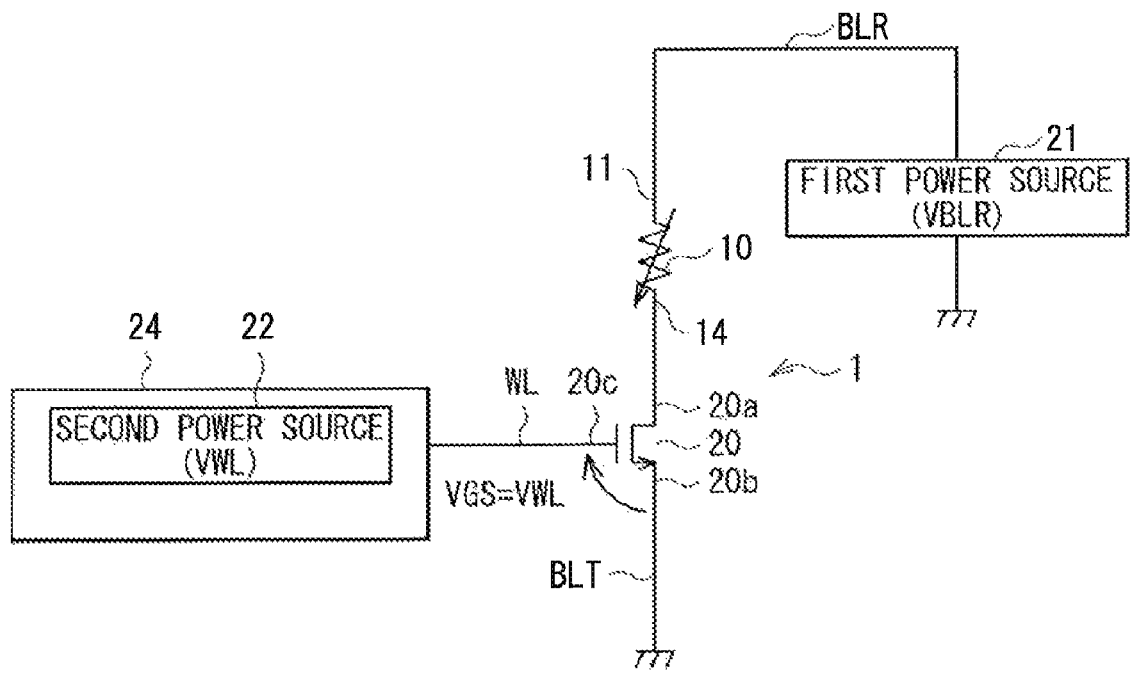
FIG. 7 is an equivalent circuit view at the time of writing the information in another memory cell.

In FIG. 7, for brief description, the bit line BLT is grounded in the equivalent circuit of FIG. 3, and thereby the current flowing to the variable resistance element 10 is controlled by the WL adjustment circuit 24 and circuit 21 only with the VWL and VBLR respectively. The cell application current at this time is as will be described below.

$$\text{Cell application current} \approx \frac{1}{2} \cdot \frac{W}{L} \mu s Cox(Vg - Vs - Vt)^2 \quad \text{[Formula 2]}$$
$$= \frac{1}{2} \cdot \frac{W}{L} \mu s Cox(VWL - Vt)^2$$

Figure 8:
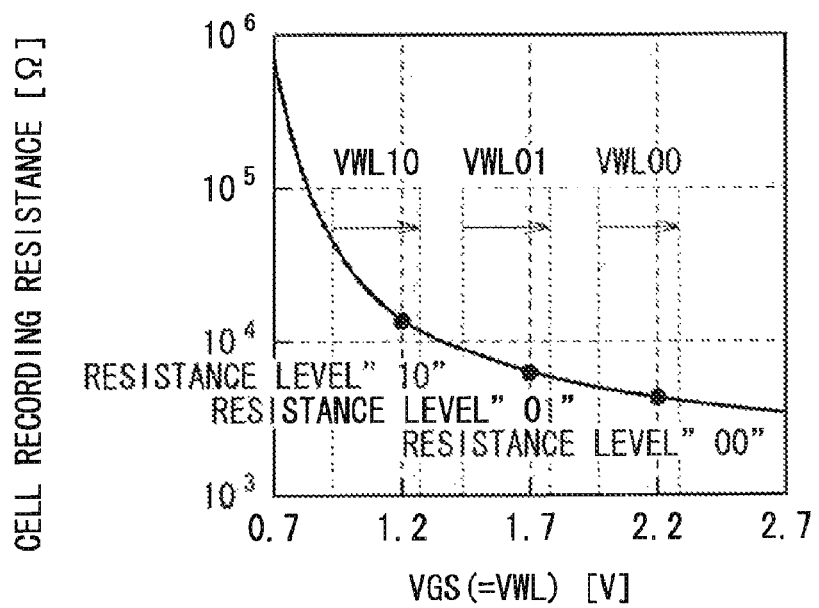
FIG. 8 is a view for explaining a cell recording resistance to the magnitude of VGS, and an initial value setting example of the VGS.

FIG. 8 illustrates the VGS (=VWL)-cell recording resistance characteristics of the memory element 10, and the initial value setting example of the VGS (VWL). Here, the 3 write resistance values of the 2 bit/cell is realized via writing and the remaining 1 erase resistance value is realized via erasing. For the information "01", an initial value VGS01 is set to be smaller than VGS (VWL)=1.7 V corresponding to the target resistance value level "01", and, for the information "00", a value lower than VGS=2.2 V corresponding to the target resistance value level "00" and higher than the above-described VGS01 is set as an initial value VGS00. Thereby, it is possible to reduce the number of cycles necessary for the verify.

FIG. 9(A) to (C) illustrate an example of the verify control in accordance with the multi-bit information in this manner. In all levels of FIG. 9(A) to (C), the verify reading is performed after the writing operation, and the writing operation is finished successfully when the resistance has been verified to be the high resistance otherwise the resistance is the low resistance meaning that the write operation has failed, and the write operation is performed again. This cycle is repeated up to the certain upper-limit number. In the case where the re-writing is performed, the voltage is increased to be larger than that of the previous writing in the VWL, and the write current is increased to adjust the resistance value level.

In addition, in the above, for the brief description, although the example where the bit line BLT is grounded has been described, the present invention is applicable to the case where the VBLT is applied from the third power source 23 to the bit line BLT as illustrated in FIG. 3. In addition, at this time, the verify control is performed by regarding that VGS=VWL-VBL. The cell application current at this time is as indicated by formula 1.

As described above, in this embodiment, since the initial value of the potential difference VGS between the gate and the source of the transistor 20 is individually set in accordance with each resistance value level of the multi-value information, the cycle number necessary for the verify is reduced, and it is possible to greatly reduce the time necessary for the multi-value recording.

Figure 12A:
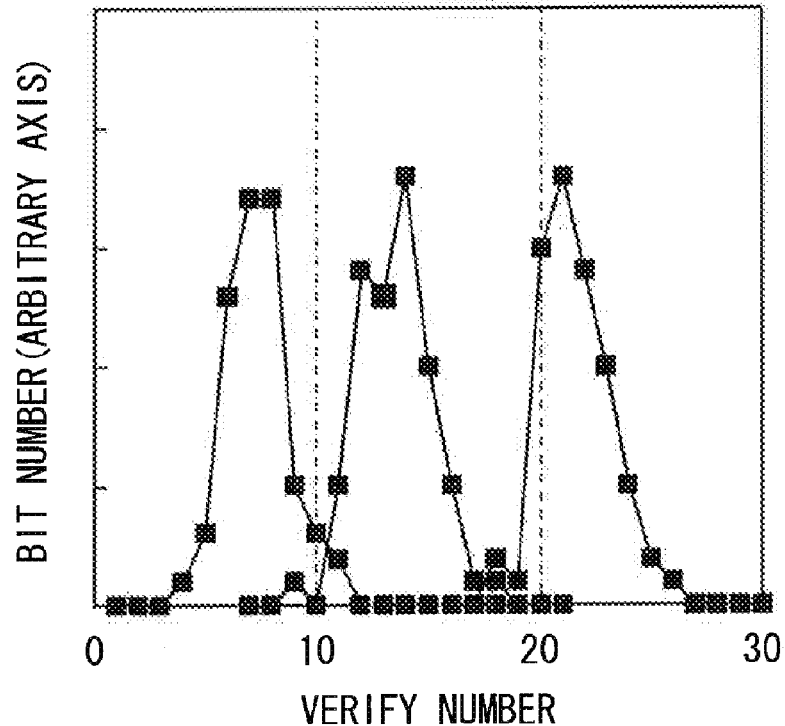
FIG. 12 is a view illustrating the relationship of a verify number and a bit number in the first embodiment.
Figure 12B:
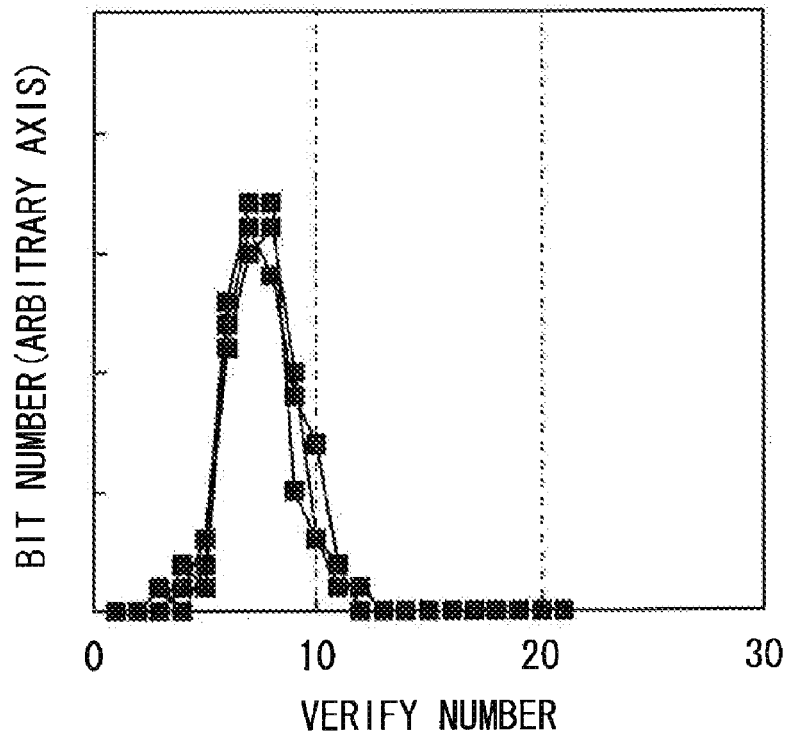

In addition, FIG. 12 illustrates the relationship between the verify number and the bit number (arbitrary axis), FIG. 12(A) illustrates the result of the case where the verify is performed by assuming that the initial value of the VWL is the same in each resistance value level, and FIG. 12(B) illustrates the result of the case where the verify is performed by optimizing the initial value of the VWL in accordance with each resistance value level. Thereby, it is understood that the verify number may be highly reduced by optimizing the initial value of the VWL in accordance with each resistance value level.

Next, a second embodiment of the present invention will be described. The description of components common to those of the first embodiment will be omitted, and only different points will be described.

Second Embodiment

In this embodiment, in the same manner as the first embodiment, at the time of the verify control, in addition to that the initial value of the VGS of the transistor 20 is individually set in accordance with each resistance value level of the multi-value information, a margin necessary between the resistance value levels may be sufficiently ensured by setting the increase ΔVGS at the time of re-recording to be the value varied in accordance with each resistance value level.

In the verify control, in the case where the resistance change of the memory cell is linear, the ΔVGS may be the fixed value in all the resistance value levels of the multi-value information, however, in the case where the resistance change is nonlinear, it is preferable to set the ΔVGS to be the value varied for each resistance value level. Hereinafter, the reason will be described.

As described above, in the verify control, although it is necessary to adjust the verify control by stepping up or stepping down the VGS until reaching the predetermined resistance value level, the relationship of the VGS and the cell recording resistance is not always in the linear shape as illustrated in FIG. 5. Thus, when the step amount is the same, the phenomenon that the resistance value is over by the verify is generated depending on the predetermined multi-value level, and there is the case where the margin necessary between the levels is not held as a result. In such a case, the verify control as will be described below may be performed.

Figure 10:
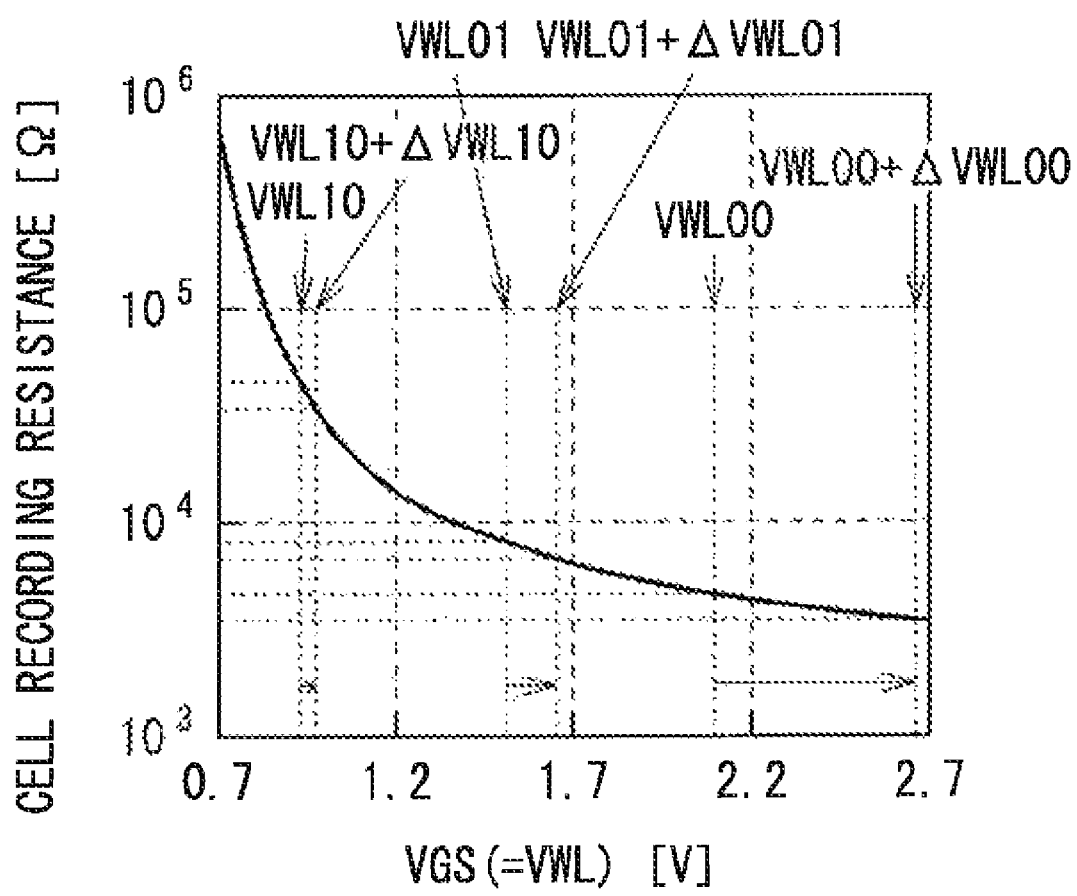
FIG. 10 is a view for explaining a change width of the cell recording resistance to the magnitude of the VGS.

FIG. 10 illustrates the change state of the cell recording resistance in the VGS (here, VGS=VWL)-cell recording resistance characteristics of the memory cell 1. According to FIG. 10, it is understood that the incremental change of the cell recording resistance is large in a region where the recording current is small, that is, the VGS is small, and the incremental change of the cell recording resistance is gradually reduced in accordance with the increase of the recording current, that is, the increase of the VGS. Thus, when the multi-bit recording is performed to the cell having such characteristics, the VGS step voltage ΔVGS in the verify is set to be smaller than another step voltage set value in a region where the incremental change of the recording resistance is large (VGS is small), and, in an opposite manner, the VGS step voltage ΔVGS in the verify is set to be larger than another step voltage set value in a region where the incremental change of the recording resistance is small (VGS is large). That is, it is effective to set the step voltage based on the magnitude relation of the incremental change based on the slope of FIG. 10) of the recording resistance.

FIGS. 11(A) to (C) illustrate the schematic view of the verify control in such a case. Here, like in FIG. 9, the example is illustrated where 3 resistance values of a 2 bit/cell are realized via writing and an additional 1 resistance value of the 2 bit/cell is realized via erasing. In all FIGS. 11(A) to (C), the verify reading is performed after the writing operation, and the writing operation is finished successfully when the resistance has been verified to be the high resistance otherwise the resistance is the low resistance meaning that the write operation has failed, and the write operation is performed again. This cycle is repeated up to the upper-limit number. In the case where the re-writing is performed, the voltage is increased to be larger than that of the previous writing in the VWL, and the write current is increased to improve the success rate of the writing.

In this embodiment, when the information "00" corresponding to the lowest resistance value level is recorded, a step voltage ΔVWL00 larger than that of another information is set as illustrated in FIG. 11(A), when the information "10" corresponding to the highest resistance value level is recorded, a step voltage ΔVWL10 smaller than that of another information is set as illustrated in FIG. 11(C), and when the middle resistance value level "01" between the both is recorded, a step voltage ΔVWL01 in the middle of the both is set as illustrated in FIG. 11(B).

As described above, in this embodiment, since the ΔVGS is varied in accordance with the resistance value level of the multi-bit information, the adjustment capability of the resistance value level is improved, and it is possible to sufficiently ensure the margin necessary between the resistance value levels. Other operational effects are the same as the first embodiment.

Figure 13:
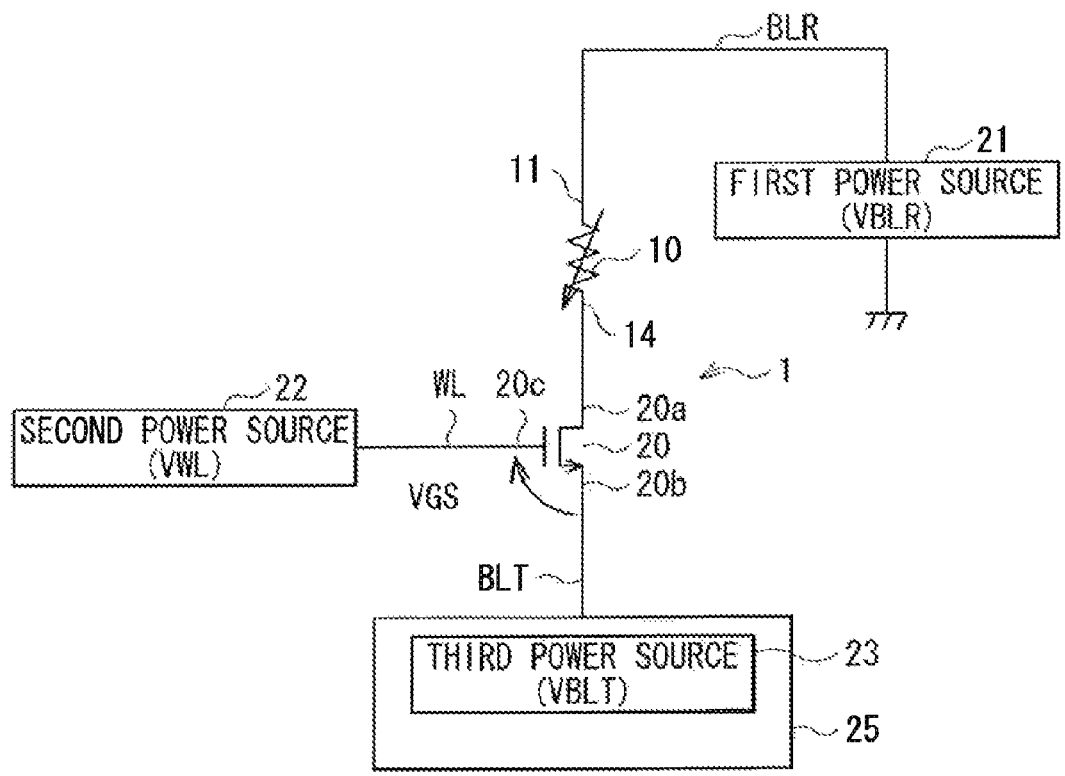
FIG. 13 is an equivalent circuit view according to a modification.
Figure 14:
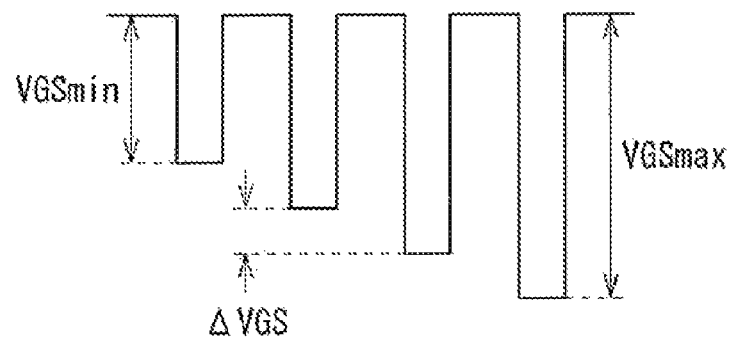
FIG. 14 is a waveform diagram for explaining the verify control in the circuit of FIG. 13.

Hereinbefore, although the present invention has been described with the embodiments, the present invention is not limited to the above-described embodiments, and various modifications are possible. For example, in the above-described embodiments, although the current flowing to the variable resistance element 10 is controlled by the WL adjustment circuit 24 only with the VWL, as illustrated in FIGS. 13 and 14, the VWL is constant, and the VBTL of the third power source 23 is variable by the adjustment circuit 25, thereby VGS (=VWL−VBTL) may be changed.

Figure 15:
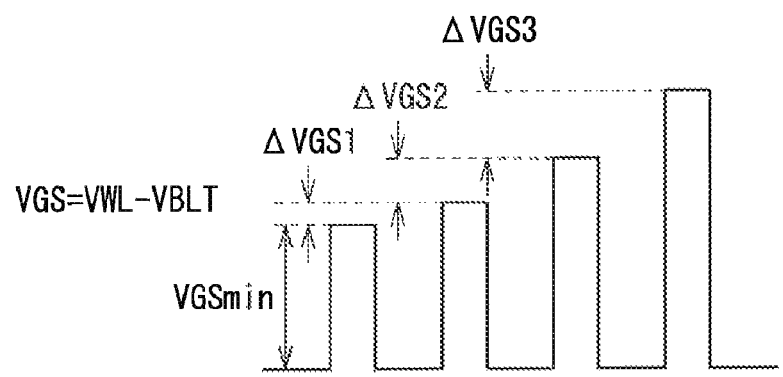
FIG. 15 is a waveform diagram for explaining another verify control.
Figure 16:
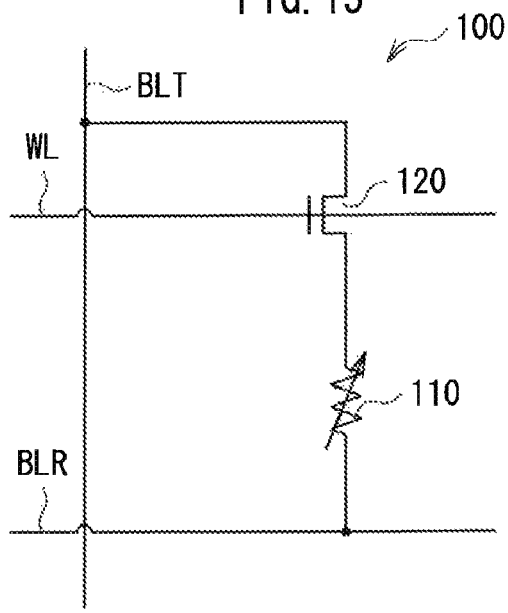
FIG. 16 is a circuit configuration view of an existing storage device (memory cell).
Figure 17:
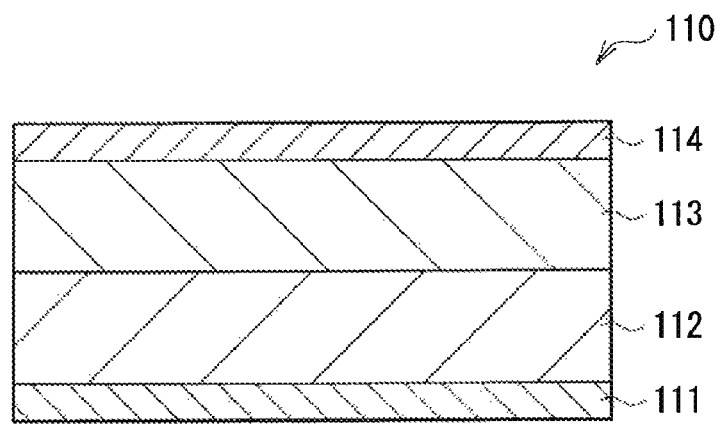
FIG. 17 is a cross-sectional view illustrating the configuration of the memory cell illustrated in FIG. 16

Also, in the above-described embodiments, although the increase ΔVGS of the potential difference between the gate and the source of the transistor 20 is the same value for each cycle, for example, the ΔVGS may be sequentially increased for each cycle like ΔVGS1, ΔVGS2, ΔVGS3, . . . as illustrated in FIG. 15.

Also, in the above-described embodiments, although the description has been made with the example of the memory cell in which one variable resistance element 10 is connected to one selection transistor (a so-called 1T-1R type memory cell), the present invention is applicable to a memory cell having the configuration in which the plurality of variable resistance elements 10 are connected to one selection transistor.

Figure 2:
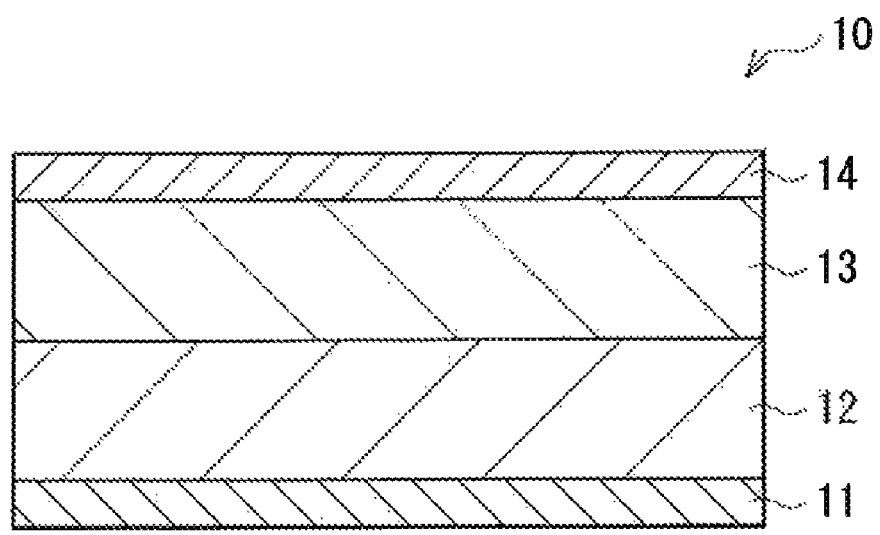
FIG. 2 is a cross-sectional view illustrating the configuration of the memory cell illustrated in FIG. 1.
Figure 3:
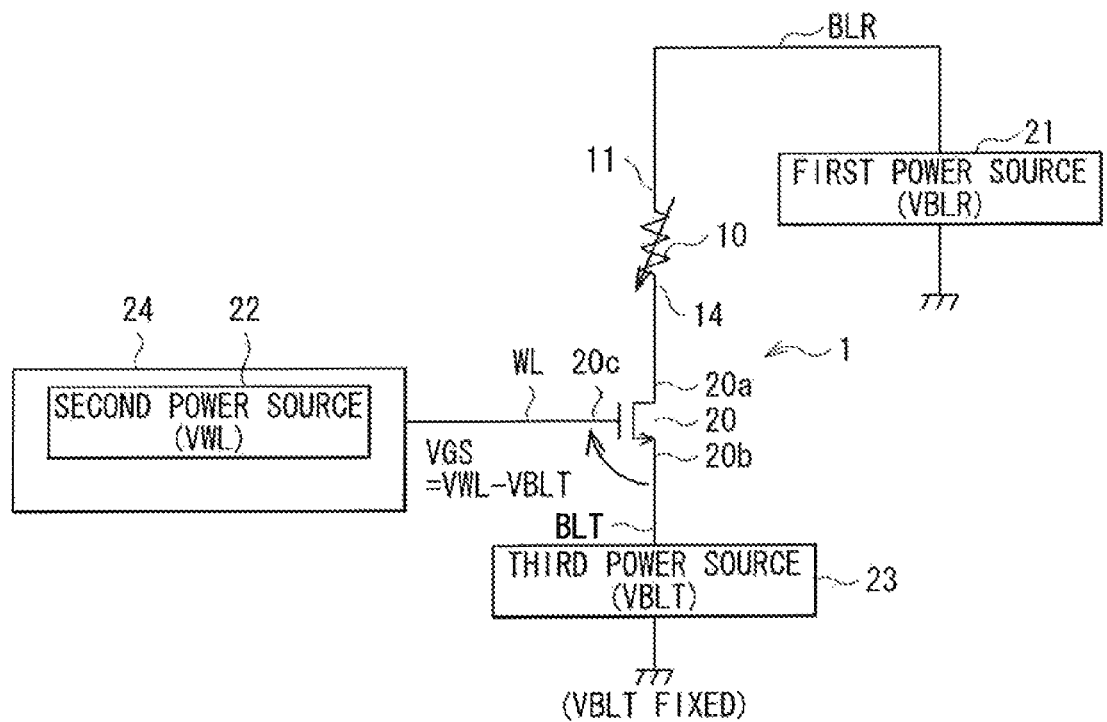
FIG. 3 is an equivalent circuit view at the time of writing information in the memory cell illustrated in FIG. 1.

Moreover, the configuration of the variable resistance element 10 is not limited to those of the above-described embodiments, and another configuration, for example, the configuration in which the stacking order of the ion source layer 12 and the high resistance layer 13 is reversed in the cross-sectional configuration of FIG. 2, the configuration in which the metal element used in the ion source layer 12 is contained in the high resistance layer 13 in substitution for providing the ion source layer 12, or, further, the configuration in which the metal element used in the ion source layer 12 is contained in the electrode, and the electrode serves also as the ion source layer 12 may be applied, and the present invention is applicable to all the storage devices using such a variable resistance element. Moreover, the storage element is not limited to the variable resistance element 10 described above, and another element, for example, a phase-change memory may be used, and the storage device using such a memory may be used.

Also, although the transistor 20 having the NMOS configuration is used as the switching element, the transistor having the PMOS configuration may be used. Moreover, the switching element of the present invention may be any as long as it has two input-output terminals and a control terminal. For example, a bipolar transistor may be used in place of or in addition to the MOS transistor.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A storage device comprising:
    a plurality of memory cells wherein each memory cell has a storage element having a pair of electrodes and multi-bit information is recorded onto the storage element by voltages being applied to the electrodes, and a switching element having a first input-output teiniinal, a second input-output terminal, and a control terminal, wherein the first input-output terminal is connected to one of the electrodes of the storage element;
    a verify control means for determining whether or not information is properly recorded onto the storage element, and performing recording in response to a result of said determining; and
    an initial value setting means for individually setting an initial value of a potential difference between the control terminal and the second input-output terminal of the switching element at a time of a verify control based on the multi-bit information when the multi-bit information is being recorded onto the storage element.

2. The storage device according to claim 1, wherein the storage element is a nonvolatile variable resistance element in which a resistance value is reversely changed between a high resistance state and a low resistance state by applying voltages of different polarities between the electrodes.

3. The storage device according to claim 2, wherein the initial value setting means sets the initial value of the potential difference at the time of the verify control to be small in a case where a resistance value level corresponds to the multi-bit information is large, and to be large in the case where the resistance value level is small.

4. The storage device according to claim 3, wherein the initial value setting means sets the initial value of the potential difference at the time of the verify control to a value corresponding to a level lower than the resistance value level corresponding to the multi-bit information.

5. The storage device according to claim 4, further comprising a potential difference change means increasing the potential difference between the control terminal and the second input-output terminal of the switching element to be larger than that of a previous recording when the recording is performed in response to the verify control means.

6. The storage device according to claim 5, wherein the potential difference change means sets an increase of the potential difference to be a value varied for each resistance value level corresponding to the multi-bit information.

7. The storage device according to claim 6, wherein the potential difference change means sets the increase of the potential difference to be a value varied in accordance with a relation of a magnitude of incremental change of a recording resistance of the variable resistance element to a current.

8. The storage device according to claim 6, wherein the potential difference change means sets the increase of the potential difference to be small in a region where the incremental change of the recording resistance of the variable resistance element by the current is large, and to be large in a region where the incremental change of the recording resistance element by the current is small.

9. The storage device according to claim 1, wherein the potential difference change means increases the potential difference by changing a voltage applied to the control terminal of the switching element.

10. The storage device according to claim 1, wherein the potential difference change means increases the potential difference by changing a voltage applied to the second input-output terminal of the switching element.

11. The storage device according to claim 1, wherein the switching element is an MOS transistor, and the potential difference change means changes a voltage between a gate and a source (VGS) of the MOS transistor.

12. The storage device according to claim 2, wherein the storage element further has a high resistance layer between the electrodes, and an ion source layer in contact with the high resistance layer and containing a metal element which is easily ionized.

13. The storage device according to claim 2, wherein the storage element has the high resistance layer between the electrodes, and contains a metal element which is easily ionized in the high resistance layer.

14. The storage device according to claim 12, wherein the metal element is at least one of the elements of Cu, Ag, and Al.

15. The storage device according to claim 12, wherein at least one of the elements of S, Se, Te and O is contained in a layer in contact with the high resistance layer, or in the high resistance layer.

16. The storage device according to claim 12, wherein, when a first pulse voltage is applied between the electrodes, the ionized metal element travels from the ion source layer to inside the high resistance layer, and a resistance of the storage element is reduced.

17. A method of recording information in a storage device including a plurality of memory cells, wherein each memory cell has a storage element having a pair of electrodes and a switching element having a first input-output terminal, a second input-output terminal, and a control terminal, wherein the first input-output terminal is connected to one of the electrodes of the storage element the method comprising:

recording multi-bit information onto the storage element by applying voltages to the electrodes in response to a result of a verify operation that determines whether or not information is properly recorded onto the storage element, wherein an initial value of a potential difference between the control terminal and the second input-output terminal of the switching element at a time of a verify control is individually set based on the multi-bit information when the multi-bit information is being recorded on the storage element.

18. The method of recording the information according to claim 17, wherein the storage element is a nonvolatile variable resistance element in which a resistance value is reversely changed between a high resistance state and a low resistance state by applying pulse voltages of different polarities between the electrodes.

* * * * *